United States Patent
Ambro et al.

[11] Patent Number: 5,177,052
[45] Date of Patent: Jan. 5, 1993

[54] MIXTURE OF DYES FOR CYAN DYE DONOR FOR THERMAL COLOR PROOFING

[75] Inventors: Joseph H. Ambro; Derek D. Chapman; Steven Evans, all of Rochester, N.Y.

[73] Assignee: Eastman Kodak Company, Rochester, N.Y.

[21] Appl. No.: 735,490

[22] Filed: Jul. 25, 1991

[51] Int. Cl.$^5$ .................. B41M 5/35; B41M 5/035
[52] U.S. Cl. .................. 503/227; 428/195; 428/913; 428/914; 428/200; 428/201; 428/945
[58] Field of Search .................. 8/471; 428/195, 913, 428/914; 430/200, 201, 945; 503/227

[56] References Cited

U.S. PATENT DOCUMENTS

| | | | |
|---|---|---|---|
| 4,695,287 | 9/1987 | Evans et al. | 8/471 |
| 4,923,846 | 5/1990 | Kutsukake et al. | 503/227 |
| 5,024,990 | 6/1991 | Evans | 503/227 |

*Primary Examiner*—B. Hamilton Hess
*Attorney, Agent, or Firm*—Harold E. Cole

[57] ABSTRACT

A cyan dye-donor element for thermal dye transfer comprising a yellow dye and a mixture of cyan dyes dispersed in a polymeric binder, at least one of the cyan dyes having the formula:

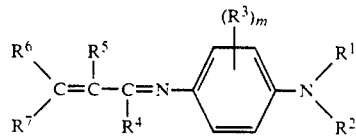

20 Claims, No Drawings

MIXTURE OF DYES FOR CYAN DYE DONOR FOR THERMAL COLOR PROOFING

This invention relates to use of a mixture of dyes in a cyan dye-donor element for thermal dye transfer imaging which is used to obtain a color proof that accurately represents the hue of a printed color image obtained from a printing press.

In order to approximate the appearance of continuous-tone (photographic) images via ink-on-paper printing, the commercial printing industry relies on a process known as halftone printing. In halftone printing, color density gradations are produced by printing ink as patterns of "dots" of varying sizes, but of constant color density, instead of varying the color density continuously as is done in photographic printing.

There is an important commercial need to obtain a color proof image before a printing press run is made which will emulate the final printed image as closely as possible. Such a pre-press proof will be used as a guide to the press operator during the set-up and calibration of the printing press. It is desired that the color proof will accurately represent at least the neutral (gray) and color tone scales of the prints obtained on the printing press. In many cases, it is also desirable that the color proof accurately represent the image quality and halftone pattern of the prints obtained on the printing press. Traditionally, such color separation proofs have involved silver halide photographic, high-contrast lithographic systems or non-silver halide (for example the Signature ® electrophotographic analog proofing system available from Eastman Kodak) light-sensitive systems which require many exposure and processing steps before a final, full-color proof is assembled.

Colorants that are used in the printing industry are insoluble pigments dispersed in a suitable carrier liquid to make an ink. By virtue of their pigment character, the printing inks yield spectrophotometric curves that are often unusually sharp on either the bathochromic or hypsochromic side. This can cause problems in designing color proofing systems in which dyes as opposed to pigments are used as the image colorants. It is very difficult to match the hue of a given ink or mixture of inks using dyes.

In U.S. Pat. No. 5,126,760, filed Apr. 25, 1990, of DeBoer, a process is described for producing a direct digital, halftone color proof of an original image on a dye-receiving element by means of laser thermal dye transfer. The proof can then be used to represent a printed color image obtained from a printing press. The process described therein comprises:
   a) generating a set of electrical signals which is representative of the shape and color scale of an original image;
   b) contacting a dye-donor element comprising a support having thereon a dye layer and an infrared-absorbing material with a first dye-receiving element comprising a support having thereon a polymeric, dye image-receiving layer;
   c) using the signals to imagewise-heat by means of a diode laser the dye-donor element, thereby transferring a dye image to the first dye-receiving element; and
   d) retransferring the dye image to a second dye image-receiving element which has the same substrate as the printed color image.

In the above process, multiple dye-donors are used to obtain a complete range of colors in the proof. For example, for a full-color proof, four colors: cyan, magenta, yellow and black are normally used.

By using the above process, the image dye is transferred by heating the dye-donor containing the infrared-absorbing material with the diode laser to volatilize the dye, the diode laser beam being modulated by the set of signals which is representative of the shape and color of the original image, so that the dye is heated to cause volatilization only in those areas in which its presence is required on the dye-receiving layer to reconstruct the original image.

Similarly, a thermal transfer proof can be generated by using a thermal head in place of a diode laser as described in U.S. Pat. No. 4,923,846. Commonly available thermal heads are not capable of generating halftone images of adequate resolution but can produce high quality continuous tone proof images which are satisfactory in many instances. U.S. Pat. No. 4,923,846 also discloses the choice of mixtures of dyes for use in thermal imaging proofing systems. The dyes are selected on the basis of values for hue error and turbidity. The Graphic Arts Technical Foundation Research Report No. 38, "Color Material" (58-(5) 293-301, 1985 gives an account of this method.

An alternative and more precise method for color measurement and analysis uses the concept of uniform color space known as CIELAB in which a sample is analyzed mathematically in terms of its spectro-photometric curve, the nature of the illuminant under which it is viewed and the color vision of a standard observer. For a discussion of CIELAB and color measurement, see "Principles of Color Technology", 2nd Edition, p.25-110, Wiley-Interscience and "Optical Radiation Measurements", Volume 2, p.33-145, Academic Press.

In using CIELAB, colors can be expressed in terms of three parameters: $L^*$, $a^*$ and $b^*$, where $L^*$ is a lightness function, and $a^*$ and $b^*$ define a point in color space. Thus, a plot of $a^*$ v. $b^*$ values for a color sample can be used to accurately show where that sample lies in color space, i.e., what its hue is. This allows different samples to be quantitatively compared.

In color proofing in the printing industry, it is important to be able to match the proofing ink references provided by the International Prepress Proofing Association. These ink references are density patches made with standard 4-color process inks and are known as SWOP (Specifications Web Offset Publications) Color References. For additional information on color measurement of inks for web offset proofing, see "Advances in Printing Science and Technology", Proceedings of the 19th International Conference of Printing Research Institutes, Eisenstadt, Austria, June 1987, J. T. Ling and R. Warner, p. 55.

U.S. Pat. No. 5,024,990 of Chapman and Evans, filed Oct. 31, 1990, describes novel dye combinations for use in color proofing applications based on thermal dye transfer imaging which offer improved cyan hue relative to the dyes of U.S. Pat. No. 4,923,846 as measured by the CIELAB method. However, there is a color reproduction problem with these improved cyan dye combinations.

For a color proofing system based on thermal dye transfer to be useful in the printing industry, it is important to be able to match the hues of the primary colors (cyan, magenta and yellow) provided by the printing inks and the analog proofing systems currently available, such as the Kodak Signature ® proofing system. However, it is also necessary to closely match the hues of the secondary colors produced by the overprinting of the various primary colors.

In particular, it is very important that the neutral (gray) scale produced by sequential overprinting of the yellow, magenta and cyan scales in the proof closely emulate the hue and tonal range of the analogous ink-on-paper print. This "gray balance" is one of the most critical parameters in the set-up of the press for the printing job. The importance of gray balance in color reproduction is discussed in Principles of Color Reproduction by J. A. C. Yule (John Wiley & Sons, 1967)

The dye mixtures of U.S. Pat. No. 5,024,990 involve combining a hypsochromic (lower λ-max, bluer) dye of Structure I with a bathochromic (higher λ-max, more cyan) dye of Structure II in a ratio which gives a good match to the CIELAB parameters of the SWOP Cyan Color Reference. However, these cyan dye combinations may not provide an acceptable gray balance when sequentially printed along with certain yellow and magenta thermal transfer dyes.

Since the SWOP Color References do not include a three color overprint reference, comparisons can be made with well-established commercial analog proofing systems, such as the Kodak Signature ® system. Visually, the thermal dye transfer three-color overprints appear green relative to the Signature ® overprints. This can be quantified by differences in the measured vector difference in CIELAB $a^* - b^*$ space, $\Delta$ ab (defined below).

Improved overprint performance (gray balance) can be achieved by increasing the amount of the dye absorbing at the lower wavelength, i.e., one according to Structure I. However, this causes an unacceptable hue shift in pure cyan images (becomes too blue) as measured by hue angle (arctan $b^*/a^*$).

We have found that acceptable neutral overprint hue can be obtained without sacrificing the cyan hue by altering the ratio of the two cyan dye components to increase the amount of the more hypsochromic dye and compensating for the cyan hue shift by the addition of small amounts of any of a variety of thermally transferrable yellow dyes.

Accordingly, this invention relates to a cyan dye-donor element for thermal dye transfer comprising a support having thereon a dye layer comprising a yellow dye and a mixture of cyan dyes dispersed in a polymeric binder, at least one of the cyan dyes having the formula:

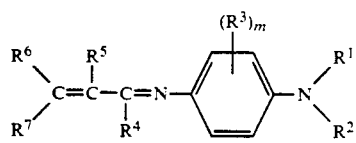

I wherein:
R$^1$ and R$^2$ each independently represents hydrogen; an alkyl group having from 1 to about 6 carbon atoms; a cycloalkyl group having from about 5 to about 7 carbon atoms; allyl; or such alkyl, cycloalkyl or allyl groups substituted with one or more groups such as alkyl, aryl, alkoxy, aryloxy, amino, halogen, nitro, cyano, thiocyano, hydroxy, acyloxy, acyl, alkoxycarbonyl, aminocarbonyl, alkoxycarbonyloxy, carbamoyloxy, acylamido, ureido, imido, alkylsulfonyl, arylsulfonyl, alkylsulfonamido, arylsulfonamido, alkylthio, arylthio, trifluoro-methyl, etc., e.g., methyl, ethyl, propyl, isopropyl, butyl, pentyl, hexyl, methoxyethyl, benzyl, 2-methanesulfonamidoethyl, 2-hydroxyethyl, 2-cyanoethyl, methoxycarbonylmethyl, cyclohexyl, cyclopentyl, phenyl, pyridyl, naphthyl, thienyl, pyrazolyl, p-tolyl, p-chlorophenyl, m-(N-methylsulfamoyl)phenyl-methyl, methylthio, butylthio, benzylthio, methanesulfonyl, pentanesulfonyl, methoxy, ethoxy, 2-methane-sulfonamido-ethyl, 2-hydroxyethyl, 2-cyanoethyl, methoxycarbonylmethyl, imidazolyl, naphthyloxy, furyl, p-tolylsulfonyl, p-chlorophenylthio, m-(N-methylsulfamoyl)phenoxy, ethoxy-carbonyl, methoxyethoxycarbonyl, phenoxy-carbonyl, acetyl, benzoyl, N,N-dimethyl-carbamoyl, dimethylamino, morpholino, anilino, pyrrolidino etc.;

or R$^1$ and R$^2$ can be joined together to form, along with the nitrogen to which they are attached, a 5- to 7-membered heterocyclic ring such as morpholine or pyrrolidine;

or either or both of R$^1$ and R$^2$ can be combined with R$^3$ to form a 5- to 7-membered heterocyclic ring;

each R$^3$ independently represents substituted or unsubstituted alkyl, cycloalkyl or allyl as described above for R$^1$ and R$^2$; alkoxy, aryloxy, halogen, thiocyano, acylamido, ureido, alkylsulfonamido, aryl-sulfonamido, alkylthio, arylthio or trifluoromethyl;

or any two of R$^3$ may be combined together to form a 5- or 6-membered carbocyclic or heterocyclic ring;

or one or two of R$^3$ may be combined with either or both of R$^1$ and R$^2$ to complete a 5- to 7-membered ring;

m is an integer of from 0 to 4;

R$^4$ represents an electron withdrawing group such as cyano, alkoxycarbonyl, aminocarbonyl, alkylsulfonyl, arylsulfonyl, acyl, nitro, etc.;

R$^5$ represents an aryl group having from about 6 to about 10 carbon atoms; a hetaryl group having from about 5 to about 10 atoms; or such aryl or hetaryl groups substituted with one or more groups such as are listed above for R$^1$ and R$^2$;

R$^6$ and R$^7$ each independently represents an electron withdrawing group such as those described above for R$^4$; or R$^6$ and R$^7$ may be combined to form the residue of an active methylene compound such as a pyrazolin-5-one, a pyrazoline-3,5-dione, a thiohydantoin, a barbituric acid, a rhodanine, a furanone, an indandione, etc., and at least one of the other of the cyan dyes having the formula:

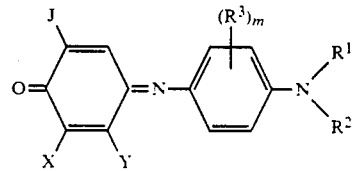

II wherein:
R$^1$, R$^2$, R$^3$ and m represent the same as above;

X represents hydrogen, halogen or may be combined together with Y to represent the atoms necessary to complete a 6-membered aromatic ring, thus forming a fused bicyclic quinoneimine, such as a naphthoquinoneimine; with the proviso that when X is hydrogen, then J represents NHCOR$_F$, where R$_F$ represents a perfluorinated alkyl or aryl group; and with the further proviso that when X is halogen, then J represents NHCOR$^8$, NHCO$_2$R$^8$, NHCONHR$^8$ or NHSO$_2$R$^8$; and with the further proviso that when X is combined with Y, then J represents CONHR$^8$, SO$_2$NHR$^8$, CN, SO$_2$R$^8$ or SCN, in which case, however, R$^8$ cannot be hydrogen;

R$^8$ is the same as R$^1$ and R$^5$ as described above; and

Y is R$^1$, R$^5$, acylamino or may be combined together with X as described above.

In a preferred embodiment for compounds according to formula I employed in the invention, R$^4$, R$^6$ and R$^7$ are cyano. In another preferred embodiment, R$^1$ is C$_2$H$_5$, C$_2$H$_4$OH, or n-C$_3$H$_7$. In yet another preferred embodiment, R$^2$ is C$_2$H$_5$ or n-C$_3$H$_7$. In yet still another preferred embodiment, R$^3$ is hydrogen, OC$_2$H$_5$, CH$_3$ or NHCOCH$_3$. In another preferred embodiment, R$^5$ is p-C$_6$H$_4$Cl, m-C$_6$H$_4$NO$_2$ or C$_{10}$H$_7$.

In a preferred embodiment for compounds according to formula II employed in the invention, R$^3$ is H, CH$_3$, OCH$_3$, or OC$_2$H$_5$. In another preferred embodiment, Y is C$_2$H$_5$ or NHCOCH$_2$OCH$_3$. In yet still another preferred embodiment, X is H and J is NHCOC$_3$F$_7$; or X is Cl and J is NHCOCH$_2$OCH$_3$; or Y and X are joined together to form a 6-membered aromatic ring and J is CONHCH$_3$.

Any yellow dye may be employed in the invention to be mixed with the cyan dyes described above. For example, there may be employed dicyanovinylaniline dyes as disclosed in U.S. Pat. Nos. 4,701,439 and 4,833,123 and JP 60/28,451, the disclosures of which are hereby incorporated by reference, e.g.,

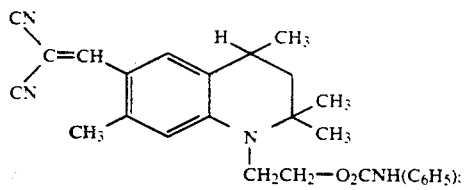

A merocyanine dyes as disclosed in U.S. Pat. Nos. 4,743,582 and 4,757,046, the disclosures of which are hereby incorporated by reference, e.g.,

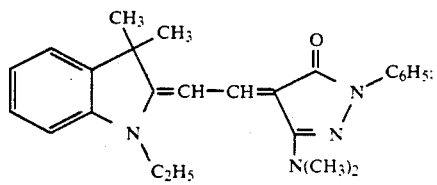

B pyrazolinone arylidene dyes as disclosed in U.S. Pat. No. 4,866,029, the disclosure of which is hereby incorporated by reference; e.g.,

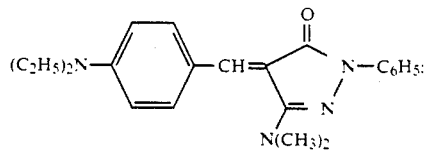

C azophenol dyes as disclosed in JP 60/30,393, the disclosure of which is hereby incorporated by reference; e.g.,

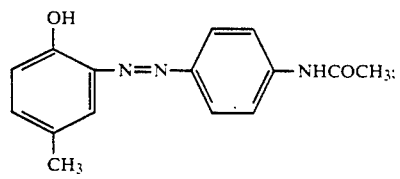

D

Disperse Yellow 3 azopyrazolinone dyes as disclosed in JP 63/182,190 and JP 63/182,191, the disclosures of which are hereby incorporated by reference, e.g.,

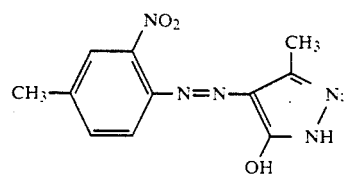

E

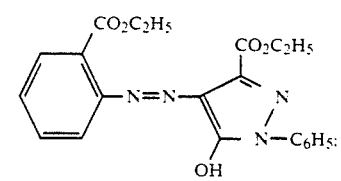

F pyrazolidinedione arylidene dyes as disclosed in U.S. Pat. No. 4,853,366, the disclosure of which is hereby incorporated by reference, e.g.,

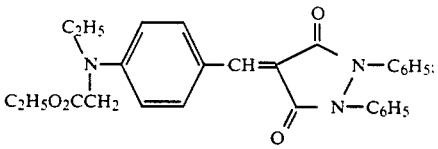

G azopyridone dyes as disclosed in JP 63/39,380, the disclosure of which is hereby incorporated by reference, e.g.,

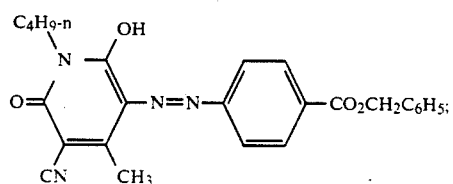

H quinophthalone dyes as disclosed in EP 318,032, the disclosure of which is hereby incorporated by reference, e.g.,

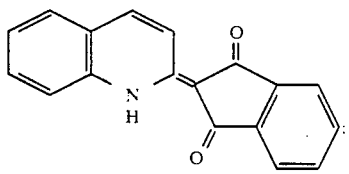

azodiaminopyridine dyes as disclosed in EP 346,729, U.S. Pat. No. 4,914,077 and DE 3,820,313, the disclosures of which are hereby incorporated by reference, e.g.,

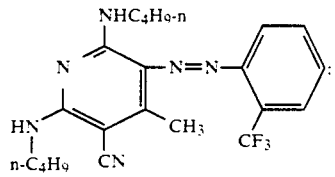

J thiadiazoleazo dyes and related dyes as disclosed in EP 331,170, JP 01/225,592 and U.S. Pat. No. 4,885,272, the disclosures of which are hereby incorporated by reference, e.g.,

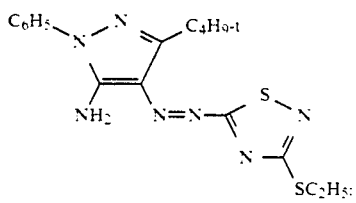

K

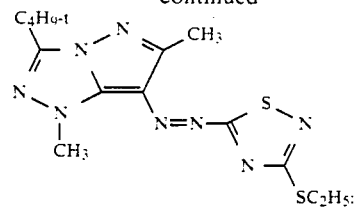

L azamethine dyes as disclosed in JP 01/176,591, EPA 279,467, JP 01/176,590, and JP 01/178,579, the disclosures of which are hereby incorporated by reference, e.g.,

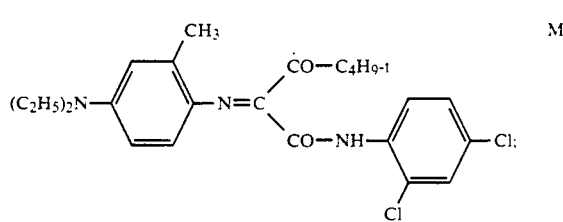

M nitrophenylazoaniline dyes as disclosed in JP 60/31,565, the disclosure of which is hereby incorporated by reference, e.g.,

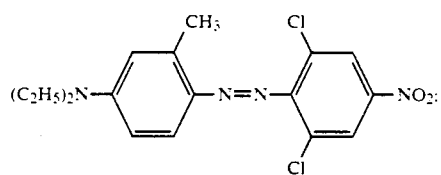

N pyrazolonethiazole dyes as disclosed in U.S. Pat. No. 4,891,353, the disclosure of which is hereby incorporated by reference; arylidene dyes as disclosed in U.S. Pat. No. 4,891,354, the disclosure of which is hereby incorporated by reference; and dicyanovinylthiazole dyes as disclosed in U.S. Pat. No. 4,760,049, the disclosure of which is hereby incorporated by reference.

Compounds included within the scope of formula I employed in the invention include the following:

| Compound | $R^1$ | $R^2$ | $R^3$ | $R^5$ |
|---|---|---|---|---|
| 1 | $C_2H_5$ | $C_2H_5$ | $CH_3$ | $C_6H_5$ |
| 2 | $C_2H_5$ | $C_2H_5$ | H | $C_6H_5$ |
| 3 | $C_2H_4OH$ | $C_2H_5$ | $CH_3$ | $C_6H_5$ |
| 4 | $C_2H_5$ | $C_2H_5$ | $OC_2H_5$ | $C_6H_5$ |
| 5 | $n\text{-}C_3H_7$ | $n\text{-}C_3H_7$ | $NHCOCH_3$ | $C_6H_5$ |
| 6 | $C_2H_5$ | $C_2H_5$ | $CH_3$ | $o\text{-}C_6H_4OCH_3$ |
| 7 | $C_2H_5$ | $C_2H_5$ | $CH_3$ | $p\text{-}C_6H_4OCH_3$ |
| 8 | $C_2H_5$ | $C_2H_5$ | $CH_3$ | $p\text{-}C_6H_4Cl$ |
| 9 | $C_2H_5$ | $C_2H_5$ | $CH_3$ | $m\text{-}C_6H_4NO_2$ |
| 10 | $C_2H_5$ | $C_2H_5$ | $CH_3$ | 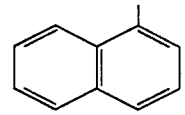 |

-continued

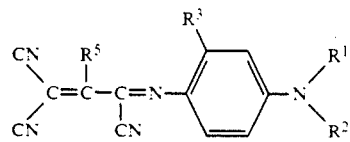

| Compound | R¹ | R² | R³ | R⁵ |
|---|---|---|---|---|
| 11 | C₂H₅ | C₂H₅ | CH₃ | 2-naphthyl |
| 12 | C₂H₅ | C₂H₅ | CH₃ | 2-benzofuryl |
| 13 | C₂H₅ | C₂H₅ | H | 2-benzofuryl |
| 14 | C₂H₅ | C₂H₅ | CH₃ | p-C₆H₄F |
| 15 | C₂H₅ | C₂H₅ | CH₃ | o-C₆H₄Cl |
| 16 | C₂H₅ | C₂H₅ | CH₃ | p-C₆H₄CN |
| 17 | C₂H₅ | C₂H₅ | CH₃ | 3,4-C₆H₃Cl₂ |
| 18 | C₂H₅ | C₂H₅ | CH₃ | 2,4-C₆H₃Cl₂ |
| 19 | C₂H₅ | C₂H₅ | CH₃ | dibenzofuryl |
| 20 | C₂H₅ | C₂H₅ | CH₃ | benzodioxolyl |
| 21 | C₂H₅ | C₂H₅ | CH₃ | 4'-chlorobiphenyl |
| 22 | C₂H₄OH | C₂H₅ | CH₃ | p-C₆H₄Cl |
| 23 | C₂H₄N—HSO₂CH₃ | C₂H₅ | CH₃ | p-C₆H₄Cl |

24

Structure with CH₃O₂C, C₆H₅, CN groups; aryl ring bearing 2,5-dimethyl and 4-N(C₂H₅)₂ substituents.

25

Structure with 1,2-diphenylpyrazolidine-3,5-dione attached via C=C(C₆H₅)—C(CN)=N— to phenyl ring bearing 3-OCH₃ and 4-N(C₂H₅)(CH₂C₆H₅).

26

Structure: (NC)₂C=C(C₆H₅)—C(CN)=N— attached to 4-N(C₂H₅)₂-naphthyl.

-continued

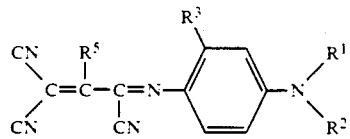

| Compound | R¹ | R² | R³ | R⁵ |
|---|---|---|---|---|

27 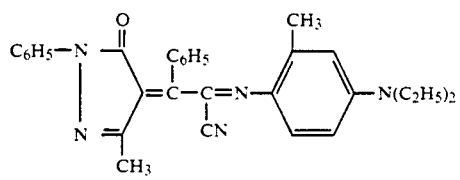

The above dyes may be prepared analogously to the method described in Example 1 below.

Cyan dyes included within the scope of the above formula II include the following:

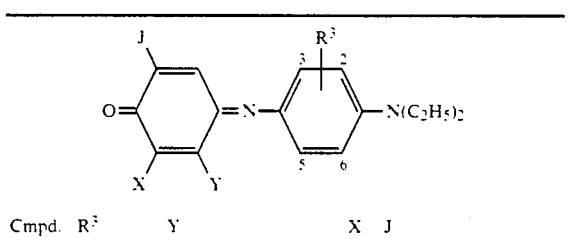

| Cmpd. | R³ | Y | X | J |
|---|---|---|---|---|
| A | 3-CH₃ | C₂H₅ | Cl | NHCOCH₂OCH₃ |
| B | 3-CH₃ | NHCOCH₂OCH₃ | H | NHCOC₃F₇ |
| C | H | —(CH=CH)₂— | | CONHCH₃ |
| D | 3-CH₃ | —(CH=CH)₂— | | CONHCH₃ |
| E | 3-OCH₃ | C₂H₅ | Cl | NHCONHC₂H₅ |
| F | 2-OCH₃ 5-CH₃ | CH₃ | Cl | NHCOC₆H₅ |
| G | 3-OC₂H₅ | C₃H- | Cl | NHSO₂C₆H₅ |
| H | H | —(CH=CH)₂— | | CN |
| I | H | —(CH=CH)₂— | | SO₂C₄H₉-n |
| J | 3-CH₃ | —(CH=CH)₂— | | CONHC₂H₄Cl |
| K | 3-C₂H₅ | —(CH=CH)₂— | | SO₂NHCH₃ |
| L | 3-OC₂H₅ | C₂H₅ | H | NHCOC₃F₇ |
| M | 2-OCH₃ | C₆H₅ | H | NHCOC₃F₇ |
| N | 3-CH₃ | C₂H₄OCH₃ | Cl | NHCOC₂H₅ |

O 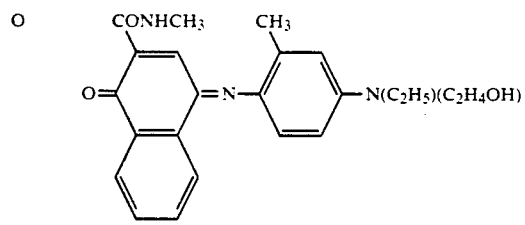

P 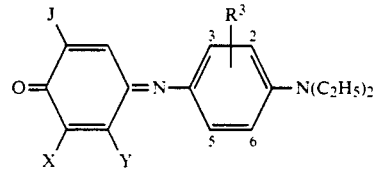

-continued

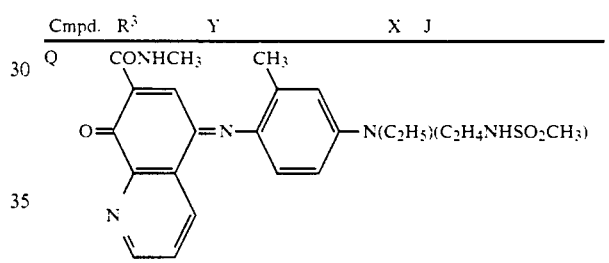

| Cmpd. | R³ | Y | X | J |
|---|---|---|---|---|
| Q | CONHCH₃ | CH₃ | | |

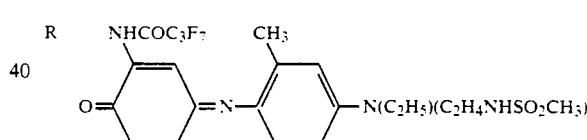

R NHCOC₃F₇  CH₃

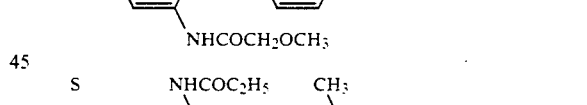

S NHCOC₂H₅  CH₃

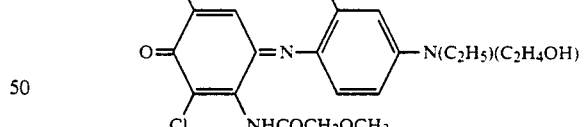

The compounds of the formula II above employed in the invention may be prepared by any of the processes disclosed in U.S. Pat. No. 4,695,287 and U.K. Patent 2,161,824, the disclosures of which are hereby incorporated by reference.

The use of dye mixtures in the dye-donor of the invention permits a wide selection of hue and color that enables a closer hue match to a variety of printing inks and also permits easy transfer of images one or more times to a receiver if desired. The use of dyes also allows easy modification of image density to any desired level. The dyes of the dye-donor element of the invention may be used at a coverage of from about 0.05 to about 1 g/m².

The amount of yellow dye in the cyan dye mixture of the invention can vary according to the particular dyes chosen. In general, the yellow dye comprises from about 1 to about 20% by weight of the total dye coverage.

The dyes in the dye-donor of the invention are dispersed in a polymeric binder such as a cellulose derivative, e.g., cellulose acetate hydrogen phthalate, cellulose acetate, cellulose acetate propionate, cellulose acetate butyrate, cellulose triacetate or any of the materials described in U.S. Pat. No. 4,700,207; a polycarbonate; polyvinyl acetate; poly(styrene-coacrylonitrile); a poly(sulfone) or a poly(phenylene oxide). The binder may be used at a coverage of from about 0.1 to about 5 $g/m^2$.

The dye layer of the dye-donor element may be coated on the support or printed thereon by a printing technique such as a gravure process.

Any material can be used as the support for the dye-donor element of the invention provided it is dimensionally stable and can withstand the heat of the laser or thermal head. Such materials include polyesters such as poly(ethylene terephthalate); polyamides; polycarbonates; cellulose esters such as cellulose acetate; fluorine polymers such as polyvinylidene fluoride or poly(tetrafluoroethylene-co-hexafluoropropylene); polyethers such as polyoxymethylene; polyacetals; polyolefins such as polystyrene, polyethylene, polypropylene or methylphentene polymers; and polyimides such as polyimide-amides and polyetherimides. The support generally has a thickness of from about 5 to about 200 μm. It may also be coated with a subbing layer, if desired, such as those materials described in U.S. Pat. Nos. 4,695,288 or 4,737,486.

The reverse side of the dye-donor element may be coated with a slipping layer to prevent the printing head from sticking to the dye-donor element. Such a slipping layer would comprise either a solid or liquid lubricating material or mixtures thereof, with or without a polymeric binder or a surface active agent. Preferred lubricating materials include oils or semi-crystalline organic solids that melt below 100° C. such as poly(vinyl stearate), beeswax, perfluorinated alkyl ester polyethers, poly(capro-lactone), silicone oil, poly(tetrafluoroethylene), carbowax, poly(ethylene glycols), or any of those materials disclosed in U.S. Pat. Nos. 4,717,711; 4,717,712; 4,737,485; and 4,738,950. Suitable polymeric binders for the slipping layer include poly(vinyl alcohol-co-butyral), poly(vinyl alcohol-co-acetal), poly(styrene), poly(vinyl acetate), cellulose acetate butyrate, cellulose acetate propionate, cellulose acetate or ethyl cellulose.

The amount of the lubricating material to be used in the slipping layer depends largely on the type of lubricating material, but is generally in the range of about 0.001 to about 2 $g/m^2$. If a polymeric binder is employed, the lubricating material is present in the range of 0.1 to 50 weight %, preferably 0.5 to 40, of the polymeric binder employed.

The dye-receiving element that is used with the dye-donor element of the invention usually comprises a support having thereon a dye image-receiving layer. The support may be a transparent film such as a poly(ether sulfone), a polyimide, a cellulose ester such as cellulose acetate, a poly(vinyl alcohol-co-acetal) or a poly(ethylene terephthalate). The support for the dye-receiving element may also be reflective such as baryta-coated paper, polyethylene-coated paper, an ivory paper, a condenser paper or a synthetic paper such as duPont Tyvek ®. Pigmented supports such as white polyester (transparent polyester with white pigment incorporated therein) may also be used.

The dye image-receiving layer may comprise, for example, a polycarbonate, a polyurethane, a polyester, polyvinyl chloride, poly(styrene-co-acrylonitrile), poly(caprolactone), a poly(vinyl acetal) such as poly(vinyl alcohol-co-butyral), poly(vinyl alcohol-co-benzal), poly(vinyl alcohol-co-acetal) or mixtures thereof. The dye image-receiving layer may be present in any amount which is effective for the intended purpose. In general, good results have been obtained at a concentration of from about 1 to about 5 $g/m^2$.

As noted above, the dye-donor elements of the invention are used to form a dye transfer image. Such a process comprises imagewise-heating a dye-donor element as described above and transferring a dye image to a dye-receiving element to form the dye transfer image.

The dye-donor element of the invention may be used in sheet form or in a continuous roll or ribbon. If a continuous roll or ribbon is employed, it may have only the dyes thereon as described above or may have alternating areas of other different dyes or combinations, such as sublimable magenta and/or yellow and/or black or other dyes. Such dyes are disclosed in U.S. Pat. No. 4,541,830, the disclosure of which is hereby incorporated by reference. Thus, one-, two-, three- or four-color elements (or higher numbers also) are included within the scope of the invention.

Thermal printing heads which can be used to transfer dye from the dye-donor elements of the invention are available commercially. There can be employed, for example, a Fujitsu Thermal Head (FTP-040 MCSOO1), a TDK Thermal Head F415 HH7-1089 or a Rohm Thermal Head KE 2008-F3.

A laser may also be used to transfer dye from the dye-donor elements of the invention. When a laser is used, it is preferred to use a diode laser since it offers substantial advantages in terms of its small size, low cost, stability, reliability, ruggedness, and ease of modulation. In practice, before any laser can be used to heat a dye-donor element, the element must contain an infrared-absorbing material, such as carbon black, cyanine infrared absorbing dyes as described in U.S. Pat. No. 4,973,572 or other materials as described in the following U.S. application Ser. Nos.: 367,062, 367,064, 367,061 and 369,492, and U.S. Pat. Nos. 4,948,777, 4,950,640, 4,950,639, 4,948,776, 4,948,776, 4,948,778, 4,942,141, 4,952,552 and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat.

Lasers which can be used to transfer dye from dye-donors employed in the invention are available commercially. There can be employed, for example, Laser Model SDL-2420-H2 from Spectra Diode Labs, or Laser Model SLD 304 V/W from Sony Corp.

A thermal printer which uses the laser described above to form an image on a thermal print medium is described and claimed in copending U.S. application Ser. No. 451,656 of Baek and DeBoer, filed Dec. 18, 1989, the disclosure of which is hereby incorporated by reference.

Spacer beads may be employed in a separate layer over the dye layer of the dye-donor in the above-described laser process in order to separate the dye-donor from the dye-receiver during dye transfer, thereby increasing the uniformity and density of the transferred image. That invention is more fully described in U.S. Pat. No. 4,772,582, the disclosure of which is hereby incorporated by reference. Alternatively, the spacer beads may be employed in the receiving layer of the dye-receiver as described in U.S. Pat. No. 4,876,235, the disclosure of which is hereby incorporated by reference. The spacer beads may be coated with a polymeric binder if desired.

The use of an intermediate receiver with subsequent retransfer to a second receiving element may also be employed in the invention. A multitude of different substrates can be used to prepare the color proof (the second receiver) which is preferably the same substrate used for the printing press run. Thus, this one intermediate receiver can be optimized for efficient dye uptake without dye-smearing or crystallization.

Examples of substrates which may be used for the second receiving element (color proof) include the following: Flo Kote Cove ® (S. D. Warren Co.), Champion Textweb ® (Champion Paper Co.), Quintessence Gloss ® (Potlatch Inc.), Vintage Gloss ® (Potlatch Inc.), Khrome Kote ® (Champion Paper Co.), Consolith Gloss ® (Consolidated Papers Co.), Ad-Proof Paper ® (Appleton Papers, Inc.) and Mountie Matte ® (Potlatch Inc.).

As noted above, after the dye image is obtained on a first dye-receiving element, it is retransferred to a second dye image-receiving element. This can be accomplished, for example, by passing the two receivers between a pair of heated rollers. Other methods of retransferring the dye image could also be used such as using a heated platen, use of pressure and heat, external heating, etc.

Also as noted above, in making a color proof, a set of electrical signals is generated which is representative of the shape and color of an original image. This can be done, for example, by scanning an original image, filtering the image to separate it into the desired additive primary colors-red, blue and green, and then converting the light energy into electrical energy. The electrical signals are then modified by computer to form the color separation data which is used to form a halftone color proof. Instead of scanning an original object to obtain the electrical signals, the signals may also be generated by computer. This process is described more fully in Graphic Arts Manual, Janet Field ed., Arno Press, New York 1980 (p. 358ff), the disclosure of which is hereby incorporated by reference.

A thermal dye transfer assemblage of the invention comprises a) a dye-donor element as described above, and b) a dye-receiving element as described above, the dye-receiving element being in a superposed relationship with the dye-donor element so that the dye layer of the donor element is in contact with the dye image-receiving layer of the receiving element.

The above assemblage comprising these two elements may be preassembled as an integral unit when a monochrome image is to be obtained. This may be done by temporarily adhering the two elements together at their margins. After transfer, the dye-receiving element is then peeled apart to reveal the dye transfer image.

When a three-color image is to be obtained, the above assemblage is formed three times using different dye-donor elements. After the first dye is transferred, the elements are peeled apart. A second dye-donor element (or another area of the donor element with a different dye area) is then brought in register with the dye-receiving element and the process repeated. The third color is obtained in the same manner.

The following examples are provided to illustrate the invention.

EXAMPLE 1

Synthesis of Compound 1

A. Synthesis of 2-phenyl-1,1,3-tricyano-propene (intermediate for Compound 1)

A mixture of benzoylacetonitrile (9.94 g, 0.0685 mole), malononitrile (11.3 g, 0.17 mole), ammonium acetate (5.4 g, 0.07 mole) and ethanol (100 mL) was heated at reflux for 1.5 hours. After cooling to room temperature, the reaction mixture was diluted with water (50 mL) and concentrated hydrochloric acid (7.5 mL) was added dropwise over 5 minutes. The resulting precipitate was collected by filtration and washed with water and ligroin. The yield was 10.0 g (76%), m.p. 92°–98° C.

B. Synthesis of Compound 1:2-phenyl-1,1,3-tricyano-3-(4-diethylamino-2-methylphenylimino)propene

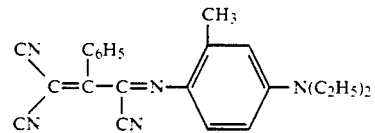

A mixture of the phenyltricyanopropene above (0.58 g, 0.003 mole) and 2-amino-5-diethylaminotoluene hydrochloride (0.64 g, 0.003 mole) in a solution of methanol (30 mL) and water (10 mL) was treated with concentrated ammonium hydroxide (1.8 mL). To this mixture was slowly added a solution of potassium ferricyanide (4.94 g, 0.015 mole) in water (20 mL), keeping the temperature below 20° C. with external cooling. After stirring for 2 hours, the reaction mixture was diluted with water (100 mL) and the resulting precipitate was collected by filtration and washed well with water. The crude dye was crystallized from methanol to yield 0.85 g (81%) of a dark green powder. The dye had a lambda max of 604 nm with a molar extinction coefficient of 44,200 (in acetone solution).

EXAMPLE 2

Individual cyan dye-donor elements were prepared by coating on a 100 μm poly(ethylene terephthalate) support a dye layer containing a mixture of the cyan dyes identified below and illustrated above and a yellow dye identified below, (total coverage 0.47 g/m$^2$) and the cyanine infrared absorbing dye illustrated below (0.054 g/m$^2$) in a cellulose acetate propionate binder (2.5% acetyl, 45% propionyl) (0.38 g/m$^2$) coated from a 70:30 mixture of 4-methyl-2-pentanone and 3A alcohol.

Comparison dye-donors using the cyan dye mixtures of U.S. Pat. No. 5,024,990 at the same levels were also prepared.

A magenta dye-donor was prepared similar to the cyan dye-donor above except using Magenta Dye A illustrated below and yellow dye A illustrated above in a ratio of 6.2:1 at a total dye coverage of 0.44 g/m$^2$ and at a binder coverage of 0.54 g/m². This combination is also claimed in U.S. Ser. No. 606,398, of Evans et al., filed Oct. 31, 1990.

A yellow dye-donor was prepared similar to the cyan dye-donor above except three yellow dyes C, illustrated above, and O and P, illustrated below, were used in a ratio of 7:57:36 at a total dye coverage of 0.27 g/m² and at a binder coverage of 0.38 g/m². This combination is also claimed in U.S. Ser. No. 606,399, of Evans et al., filed Oct. 31, 1990.

Cyanine Infrared Absorbing Dye

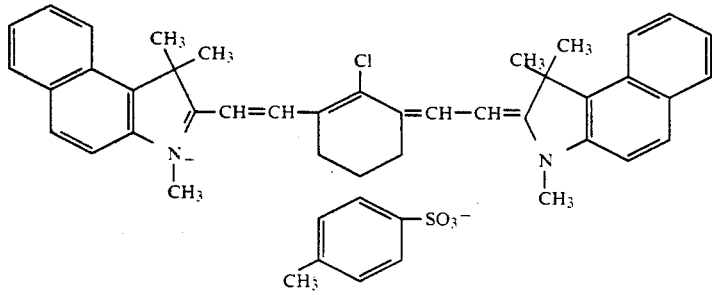

Magenta Dye A

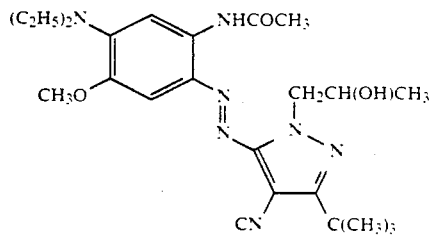

Yellow Dye O

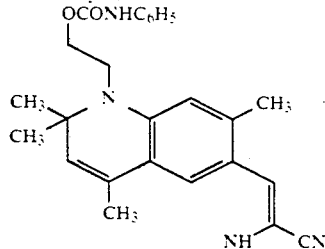

Yellow Dye P

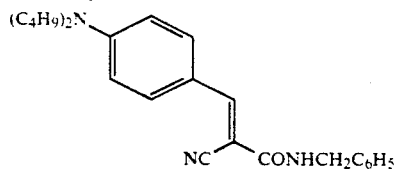

An intermediate dye receiving element was prepared by coating the following layer on the metallized surface of aluminized 100 μm thick poly(ethylene-terephthalate) support:
  a mixture of Butvar B-76 ® polyvinyl alcohol-co-butyral (Monsanto Company) (8.6 g/m²), cross-linked poly(styrene-co-divinylbenzene) beads (12 μm average diameter) (0.09 g/m²) and FC-431 ® surfactant (3M Corp) (0.04 g/m²) from a mixture of 80:20 3A alcohol:methanol.

Single color and three-color overprint images were printed as described below from dye-donors onto a receiver using a laser imaging device as described in U.S. Pat. No. 4,876,235. The laser imaging device consisted of an array of 18 diode lasers connected via fiber optic couplings to a lens assembly mounted on a translation stage and focussed onto the dye-donor layer with a 25 micron spot size. The diode lasers were obtained from Spectra Diode Labs and are rated at 500 mwatts but optical losses reduce the power at the image plane to approximately 160 mwatts.

The dye-receiving element was secured to the cylindrical drum of the diode laser imaging device with the receiving layer facing out. The dye-donor element was secured in face-to-face contact with the receiving element.

The drum was rotated at 400 rpm and the imaging electronics were activated. The translation stage was incrementally advanced across the dye-donor by means of a lead screw turned by a microstepping motor, to give a center-to-center line distance of 14.1 microns (708.7 lines per centimeter, or 1800 lines per inch).

After the laser array had finished scanning the image area the laser exposing device was stopped and the intermediate receiver was separated from the dye donor. The intermediate receiver containing the transferred dye image was laminated to Textweb ® (Champion Papers, Inc.) 60 pound stock paper (which had previously been laminated with a layer of 370 mg/ft² Butvar B-76 ® polyvinyl alcohol-co-butyral) by passage through a pair of rubber rollers heated to 120° C. The polyethylene terephthalate support was then peeled away leaving the dye image and polyvinyl alcohol-co-butyral firmly adhered to the paper-polyvinyl alcohol-co-butyral laminate. The paper stock was chosen to represent the substrate used for a printed ink image obtained from a printing press.

For the monochrome cyan images the power to the laser array was modulated to produce a continuous tone image consisting of uniform "steps" of varying density. The "N" response reflection density of each of the steps was read with an X-Rite Model 408 densitometer. The CIELAB a* and b* color coordinates were determined for the step matching the SWOP Color Reference density (within 0.05) with an X-Rite Model 968 spectrophotometer-colorimeter (D5000 illuminant, 2 degree observer). The results are listed in Table 1.

Three-color overprint images were then prepared by sequentially imaging various combinations of the cyan, magenta and yellow dye-donors described above in register onto the same intermediate receiver layer. In this case, the laser array was modulated to produce stepped half-tone images of varying density, by printing dot patterns of varying dot size (area coverage). The printer settings were selected so that the 100% dot area densities obtained from each dye donor would match the SWOP Color Reference densities.

The cyan donors were printed so that the stepped image varied from 10–100% dot area, while the yellow and magenta donors were printed at a relative dot area reduction relative to the cyan donor, which is a typical graphic arts industry practice. For example, when the cyan donor was printed at 50% dot area, the magenta and yellow donors were each printed at 41% dot area.

A similar three-color overprint image was prepared using the Kodak Signature ® electrophotographic proofing system, using half-tone separation films (generated from the same digital data used to generate the above images) and analogous set-up parameters.

The CIELAB a* and b* coordinates of the step corresponding to 50% dot area cyan (this corresponds to the density range of maximum sensitivity for an observer) were read as above and the data is collected in Table 2.

The color differences among the samples can be expressed as $\Delta$ ab, where $\Delta$ ab is the vector difference in a*—b* color space between the laser thermal generated image and the Signature ® image:

$$\text{i.e. } \sqrt{(a^*_e - a^*_s)^2 + (b^*_e - b^*_s)^2}$$

e = experiment (transferred dye)
s = Signature ®

The hue angle was also determined as follows:

$$\text{Hue angle} = \arctan b^*/a^* + 180$$

TABLE 1

| | COLORIMETRY FOR CYAN MONOCHROMES | | | | | | |
|---|---|---|---|---|---|---|---|
| Cyan Dye-Donor | Cyan Cmpd. 8[1] (wt. %) | Yellow Dye A or C[1] (wt. %) | CYAN MONOCHROMES (100% DOT) | | | | |
| | | | Density | a* | b* | Hue Angle | $\Delta$ Hue Angle[2] |
| SWOP | — | — | 1.31 | −37 | −39 | 226.5 | — |
| 1 | 52 | A (8) | 1.35 | −31.7 | −33.9 | 227 | 0.5 |
| 2 | 35 | A (4) | 1.35 | −32.9 | −34.5 | 226 | −0.5 |
| 3 | 30.5 | A (2.5) | 1.33 | −31.8 | −36.2 | 229 | 2.5 |
| 4 | 25 | A (1) | 1.36 | −32 | −36.8 | 229 | 2.5 |
| 5 | 50.6 | C (4) | 1.35 | −30 | −34 | 228.5 | 2 |
| 6 | 40 | C (3) | 1.32 | −31.7 | −32.7 | 226 | −0.5 |
| 7 | 32.5 | C (2) | 1.33 | −32.5 | −33.6 | 226 | −0.5 |
| 8 | 25 | C (1) | 1.36 | −33 | −34.7 | 226.5 | 0 |
| C-1 | 20 | 0 | 1.32 | −32.7 | −35.2 | 227 | 0.5 |
| C-2 | 35 | 0 | 1.34 | −27.7 | −41.8 | 236.5 | 10 |
| C-3 | 50 | 0 | 1.35 | −24.2 | −44.6 | 241.5 | 15 |

[1]The remainder of the image dye in each case is Cyan Compound D above.
[2]Hue angle (experiment) - hue angle (SWOP)

The hue angles for Cyan Dye-Donors 1–8 are not significantly different from the hue angle of the SWOP Color Reference ($\Delta$ Hue Angle less than 2.5) in comparison to the Control Donors C-2 and C-3 containing high levels of Cyan Compound 8. Although Control C-1 has an acceptable hue angle, it has poorer 3-color overprint performance as shown by Table 2 below.

The above results show that the increase in the relative level of the more hypsochromic dye of Structure I, i.e., Cyan Dye 8, of U.S. Pat. No. 5,024,990 results in unacceptable hue shifts as measured by hue angle.

TABLE 2

| COLORIMETRY FOR 3-COLOR OVERPRINTS | | | | | |
|---|---|---|---|---|---|
| Cyan Dye-Donor | Cmpd. 8[1] (wt. %) | Yellow Dye A or C[1] (wt. %) | THREE COLOR OVERPRINT (AT 50% DOT AREA) | | |
| | | | a* | b* | $\Delta$ ab |
| Signature ® | — | — | 1.2 | 5.9 | — |
| 1 | 52 | A (8) | −0.6 | 5.8 | 1.8 |
| 2 | 35 | A (4) | −1 | 5.6 | 2.2 |
| 5 | 50.6 | C (4) | −0.3 | 5.2 | 1.7 |
| 6 | 40 | C (3) | −1.3 | 6.0 | 2.5 |
| 7 | 32.5 | C (2) | −1.3 | 5.2 | 2.6 |
| Control C-1 | 20 | 0 | −2.8 | 5.4 | 4 |
| Control C-2 | 35 | 0 | −1.7 | 5.2 | 3 |
| Control C-3 | 50 | 0 | −0.3 | 3.6 | 2.7 |

[1]The remainder of the image dye in each case is Cyan Compound D above.

The above results show that improvements in the three-color overprint performance as measured by the reduction in the difference in ab from an analogous Signature ® image can be obtained by increasing the level of the more hypsochromic dye of Structure I of U.S. Pat. No. 5,024,990 in the cyan donor ($\Delta$ ab of Donors 1, 2, 5, 6, 7, C-2 and C-3).

Control C-1 has poor overprint performance since it has a larger $\Delta$ ab. While Controls C-2 and C-3 have better overprint performance, they have poor cyan hue as shown above in Table 1.

Acceptable cyan hues and 3-color overprint performance can be obtained by adding an appropriate level of either of two quite different yellow dyes. Thus, the benefits of improved three-color overprint performance can be achieved without a negative impact on the hue of the cyan monochrome by adding a small amount of a suitable yellow dye to the cyan dye donor formulation.

The invention has been described in detail with particular reference to preferred embodiments thereof, but it will be understood that variations and modifications can be effected within the spirit and scope of the invention.

What is claimed is:

1. A cyan dye-donor element for thermal dye transfer comprising a support having thereon a dye layer comprising a yellow dye and a mixture of cyan dyes dispersed in a polymeric binder, at least one of the cyan dyes having the formula:

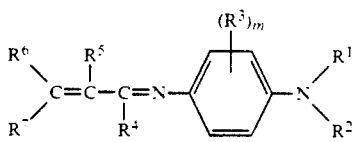

wherein:
$R^1$ and $R^2$ each independently represents hydrogen; a substituted or unsubstituted alkyl group having from 1 to about 6 carbon atoms; a substituted or unsubstituted cycloalkyl group having from about 5 to about 7 carbon atoms or a substituted or unsubstituted allyl group;
or $R^1$ and $R^2$ can be joined together to form, along with the nitrogen to which they are attached, a 5- to 7-membered heterocyclic ring;
or either or both of $R^1$ and $R^2$ can be combined with $R^3$ to form a 5- to 7-membered heterocyclic ring;
each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, alkylthio, arylthio or trifluoromethyl;
or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;
m is an integer of from 0 to 4;
$R^4$ represents an electron withdrawing group;
$R^5$ represents a substituted or unsubstituted aryl group having from about 6 to about 10 carbon atoms or a substituted or unsubstituted hetaryl group having from about 5 to about 10 atoms;
$R^6$ and $R^7$ each independently represents an electron withdrawing group; or
$R^6$ and $R^7$ may be combined to form the residue of an active methylene compound;
and at least one of the other of the cyan dyes having the formula:

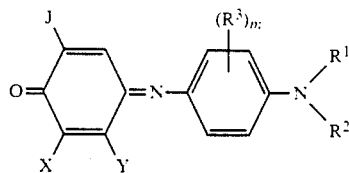

wherein:
$R^1$, $R^2$, $R^3$ and m represent the same as above;
X represents hydrogen, halogen or may be combined together with Y to represent the atoms necessary to complete a 6-membered aromatic ring; with the proviso that when X is hydrogen, then J represents $NHCOR_F$, where $R_F$ represents a perfluorinated alkyl or aryl group; and with the further proviso that when X is halogen, then J represents $NHCOR^8$, $NHCO_2R^8$, $NHCONHR^8$ or $NHSO_2R^8$; and with the further proviso that when X is combined with Y, then J represents $CONHR^8$, $SO_2NHR^8$, CN, $SO_2R^8$ or SCN, in which case, however, $R^8$ cannot be hydrogen;
$R^8$ is the same as $R^1$ and $R^5$ as described above; and
Y is $R^1$, $R^5$, acylamino or may be combined together with X as described above.

2. The element of claim 1 wherein $R^4$, $R^6$ and $R^7$ in formula I are cyano.

3. The element of claim 1 wherein in formula I, $R^1$ is $C_2H_5$, $C_2H_4OH$, or n-$C_3H_7$ and $R^2$ is $C_2H_5$ or n-$C_3H_7$.

4. The element of claim 1 wherein $R^3$ in formula I is hydrogen, $OC_2H_5$, $CH_3$ or $NHCOCH_3$.

5. The element of claim 1 wherein $R^5$ in formula I is p-$C_6H_4Cl$, m-$C_6H_4NO_2$ or $C_{10}H_7$.

6. The element of claim 1 wherein $R^3$ in formula II is H, $CH_3$, $OCH_3$, or $OC_2H_5$.

7. The element of claim 1 wherein Y in formula II is $C_2H_5$ or $NHCOCH_2OCH_3$.

8. The element of claim 1 wherein X is H and J is $NHCOC_3F_7$, or X is Cl and J is $NHCOCH_2OCH_3$.

9. The element of claim 1 wherein Y and X are joined together to form a 6-membered aromatic ring and J is $CONHCH_3$.

10. The element of claim 1 wherein said yellow dye is present in an amount of about 1 to about 20% by weight of the total amount of dye present.

11. The element of claim 1 wherein said yellow dye is selected from the azopyridone, azoaniline, azophenol, azopyrazolinone, dicyanovinylaniline, merocyanine, pyrazolinone arylidene, quinophthalone, pyrazolidinedione arylidene, ketomethylene azamethine, thiadiazoleazo, azodiaminopyridine, nitrophenylazoaniline, pyrazolonethiazole and dicyanovinylthiazole dye classes.

12. The element of claim 1 wherein said dye-donor element contains an infrared-absorbing dye in said dye layer.

13. In a process of forming a dye transfer image comprising imagewise-heating a cyan dye-donor element comprising a support having thereon a dye layer comprising a yellow dye and a mixture of cyan dyes dispersed in a polymeric binder, at least one of the cyan dyes having the formula:

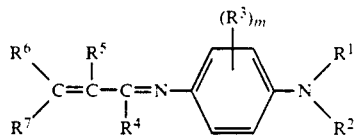

wherein:
- $R^1$ and $R^2$ each independently represents hydrogen; a substituted or unsubstituted alkyl group having from 1 to about 6 carbon atoms; a substituted or unsubstituted cycloalkyl group having from about 5 to about 7 carbon atoms or a substituted or unsubstituted allyl group;
- or $R^1$ and $R^2$ can be joined together to form, along with the nitrogen to which they are attached, a 5- to 7-membered heterocyclic ring;
- or either or both of $R^1$ and $R^2$ can be combined with $R^3$ to form a 5- to 7-membered heterocyclic ring;
- each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, alkylthio, arylthio or trifluoromethyl;
- or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;
- m is an integer of from 0 to 4;
- $R^4$ represents an electron withdrawing group;
- $R^5$ represents a substituted or unsubstituted aryl group having from about 6 to about 10 carbon atoms or a substituted or unsubstituted hetaryl group having from about 5 to about 10 atoms;
- $R^6$ and $R^7$ each independently represents an electron withdrawing group; or
- $R^6$ and $R^7$ may be combined to form the residue of an active methylene compound;

and at least one of the other of the cyan dyes having the formula:

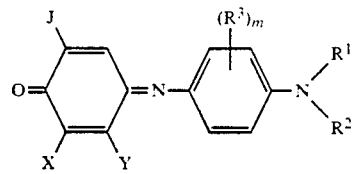

wherein:
- $R^1$, $R^2$, $R^3$ and m represent the same as above;
- X represents hydrogen, halogen or may be combined together with Y to represent the atoms necessary to complete a 6-membered aromatic ring; with the proviso that when X is hydrogen, then J represents NHCOR$_F$, where R$_F$ represents a perfluorinated alkyl or aryl group; and with the further proviso that when X is halogen, then J represents NHCOR$^8$, NHCO$_2$R$^8$, NHCONHR$^8$ or NHSO$_2$R$^8$; and with the further proviso that when X is combined with Y, then J represents CONHR$^8$, SO$_2$NHR$^8$, CN, SO$_2$R$^8$ or SCN, in which case, however, R$^8$ cannot be hydrogen;
- $R^8$ is the same as $R^1$ and $R^5$ as described above; and

- Y is $R^1$, $R^5$, acylamino or may be combined together with X as described above.

14. The process of claim 13 wherein in formula I, $R^4$, $R^6$ and $R^7$ are cyano; $R^1$ is $C_2H_5$, $C_2H_4OH$, or n-$C_3H_7$; $R^2$ is $C_2H_5$ or n-$C_3H_7$; $R^3$ is hydrogen, $OC_2H_5$, $CH_3$ or $NHCOCH_3$; and $R^5$ is p-$C_6H_4Cl$, m-$C_6H_4NO_2$ or $C_{10}H_7$.

15. The process of claim 13 wherein in formula II, $R^3$ is H, $CH_3$, $OCH_3$ or $OC_2H_5$; Y is $C_2H_5$ or NHCOCH$_2$OCH$_3$; and X is H and J is NHCOC$_3$F$_7$; or X is Cl and J is NHCOCH$_2$OCH$_3$; or Y and X are joined together to form a 6-membered aromatic ring and J is CONHCH$_3$.

16. The process of claim 13 wherein said dye-donor element contains an infrared-absorbing dye in said dye layer.

17. In a thermal dye transfer assemblage comprising:
a) a cyan dye-donor element comprising a support having thereon a dye layer comprising a mixture of cyan dyes dispersed in a polymeric binder, and
b) a dye-receiving element comprising a support having thereon a dye image-receiving layer, said dye-receiving element being in a superposed relationship with said cyan dye-donor element so that said dye layer is in contact with said dye image-receiving layer, the improvement wherein said dye layer comprises a yellow dye and a mixture of cyan dyes, at least one of the cyan dyes having the formula:

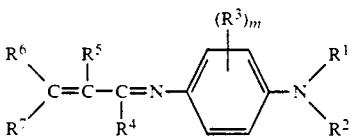

wherein:
- $R^1$ and $R^2$ each independently represents hydrogen; a substituted or unsubstituted alkyl group having from 1 to about 6 carbon atoms; a substituted or unsubstituted cycloalkyl group having from about 5 to about 7 carbon atoms or a substituted or unsubstituted allyl group;
- or $R^1$ and $R^2$ can be joined together to form, along with the nitrogen to which they are attached, a 5- to 7-membered heterocyclic ring;
- or either or both of $R^1$ and $R^2$ can be combined with $R^3$ to form a 5- to 7-membered heterocyclic ring;
- each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, alkylthio, arylthio or trifluoromethyl;
- or any two of $R^3$ may be combined together to form a 5- or 6-membered carbocyclic or heterocyclic ring; or one or two of $R^3$ may be combined with either or both of $R^1$ and $R^2$ to complete a 5- to 7-membered ring;
- m is an integer of from 0 to 4;
- $R^4$ represents an electron withdrawing group;
- $R^5$ represents a substituted or unsubstituted aryl group having from about 6 to about 10 carbon atoms or a substituted or unsubstituted hetaryl group having from about 5 to about 10 atoms;
- $R^6$ and $R^7$ each independently represents an electron withdrawing group; or $R^6$ and $R^7$ may be combined to form the residue of an active methylene compound;

and at least one of the other of the cyan dyes having the formula:

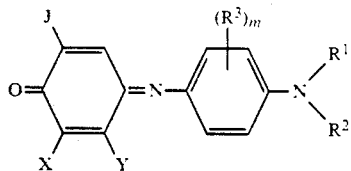

II wherein:

$R^1$, $R^2$, $R^3$ and m represent the same as above;

X represents hydrogen, halogen or may be combined together with Y to represent the atoms necessary to complete a 6-membered aromatic ring; with the proviso that when X is hydrogen, then J represents $NHCOR_F$, where $R_F$ represents a perfluorinated alkyl or aryl group; and with the further proviso that when X is halogen, then J represents $NHCOR^8$, $NHCO_2R^8$, $NHCONHR^8$ or $NHSO_2R^8$; and with the further proviso that when X is combined with Y, then J represents $CONHR^8$, $SO_2NHR^8$, CN, $SO_2R^8$ or SCN, in which case, however, $R^8$ cannot be hydrogen;

$R^8$ is the same as $R^1$ and $R^5$ as described above; and

Y is $R^1$, $R^5$, acylamino or may be combined together with X as described above.

18. The assemblage of claim 17 wherein in formula I, $R^4$, $R^6$ and $R^7$ are cyano; $R^1$ is $C_2H_5$, $C_2H_4OH$, or n-$C_3H_7$; $R^2$ is $C_2H_5$ or n-$C_3H_7$; $R^3$ is hydrogen, $OC_2H_5$, $CH_3$ or $NHCOCH_3$; and $R^5$ is p-$C_6H_4Cl$, m-$C_6H_4NO_2$ or $C_{10}H_7$.

19. The assemblage of claim 17 wherein in formula II, $R^3$ is H, $CH_3$, $OCH_3$ or $OC_2H_5$; Y is $C_2H_5$ or $NHCOCH_2OCH_3$; and X is H and J is $NHCOC_3F_7$; or X is Cl and J is $NHCOCH_2OCH_3$; or Y and X are joined together to form a 6-membered aromatic ring and J is $CONHCH_3$.

20. The assemblage of claim 17 wherein said dye-donor element contains an infrared-absorbing dye in said dye layer.

* * * * *